THYRISTOR SWITCHING AMPLIFIERS FOR RAPIDLY SWITCHING-ON INDUCTIVE LOADS

Filed March 12, 1965

INVENTOR.
PETER BLUME
BY
Frank R. Jinfani
AGENT

United States Patent Office 3,374,422

Patented Mar. 19, 1968

3,374,422

THYRISTOR SWITCHING AMPLIFIERS FOR RAPIDLY SWITCHING-ON INDUCTIVE LOADS

Peter Blume, Hamburg-Lurup, Germany, assignor to North American Philips Company, Inc., New York, N.Y., a corporation of Delaware Filed Mar. 12, 1965, Ser. No. 439,362
Claims priority, application Germany, Mar. 14, 1964, P 33,840
3 Claims. (Cl. 323—22)

ABSTRACT OF THE DISCLOSURE

A switching circuit for an inductive load is provided with a voltage source having an RC circuit connected in series with an auxiliary inductor and a thyristor, and a diode connected in parallel with the inductive load. The gating circuit is responsive to the instantaneous voltage across the capactitive element of the RC circuit to gate a pulse triggering the thyristor into conduction, and the capacitor voltage of the RC circuit thereby controls the extinguishing of the thyristor through the action of the auxiliary inductor.

This invention relates to switching amplifiers, operated by controlled contacts, for rapidly switching-on inductors requiring only a low power in the "on" condition.

A rapidly switching amplifier has previously been suggested which comprises substantially two functional parts. One functional part determines the behaviour upon switching-on and the other ensures the continuous energization of the load with a minimum consumption of energy. Transistors are then used as switches. Their switching power, which is the product of the maximum collector current and the maximum collector voltage, is at most approximately 1 kw. Since the switching period is indirectly proportional to the switching power of the switches transistors are often inadequate for obtaining a short switching-on period. If the energy absorbed by the inductor during switching-on is, for example, $W=100$ mw., the switching period is approximately 200 $\mu$sec. Shorter periods can be obtained only by a greatly increased consumption of energy.

However, a considerable reduction in the switching period may be obtained by using structural elements, for example, thyristors, which have a greater dielectric strength. Thyristors, in certain cases referred to as "semiconductor controlled rectifiers" or "semiconductor thyratrons," are semiconductor structural elements comprising four semiconductor layers and capable of switching currents of the order from 10 to 100 amps. Their dielectric strength is several hundreds of volts. Thyristors, as their name already indicates, exhibit a switching behaviour similar to that of thyratrons. The anode-cathode path is made conducting by short pulses at the control electrode and remains conducting until either the current is interrupted or the voltage is inverted in polarity by external means.

From his mode of functioning it is easily understood that the switching-off of such switching elements when used in D.C. pulse circuits causes difficulty. It is therefore impossible merely to replace transistors by thyristors in known circuits.

According to the invention, a circuit in which allowance is made for the particular properties of these switching elements consists in that the switch for switching-on the inductor comprises an RC-element and a thyristor, together with an interposed smaller inductor, herein referred to as "auxiliary inductor," a diode being connected in parallel with the inductor to be switched. For speeding up the switching-off operation it is possible to connect a resistor in series with the said diode.

In order that the invention may be readily carried into effect, it will now be described in detail, by way of example, with reference to the accompanying diagrammatic drawing, in which.

Since, after each switching-on operation, the thyristor switch must be extinguished, that is to say switched-off, it is possible to use only a switching-on voltage variable with time instead of the usual constant switching-on voltage. The variation in voltage must be such that the voltage in the "off" condition first has the predetermined nominal value and retains this value for the duration of the switch-on pulse until the nominal load current is reached and then switches over to a low voltage of opposite polarity to return eventually to its initial value after extinction of the thyristor. The realisation of such a voltage source would be too expensive. According to the invention, however, a similar behaviour is obtained by means of a capacitor discharge circuit including an auxiliary inductor.

Figure 1:
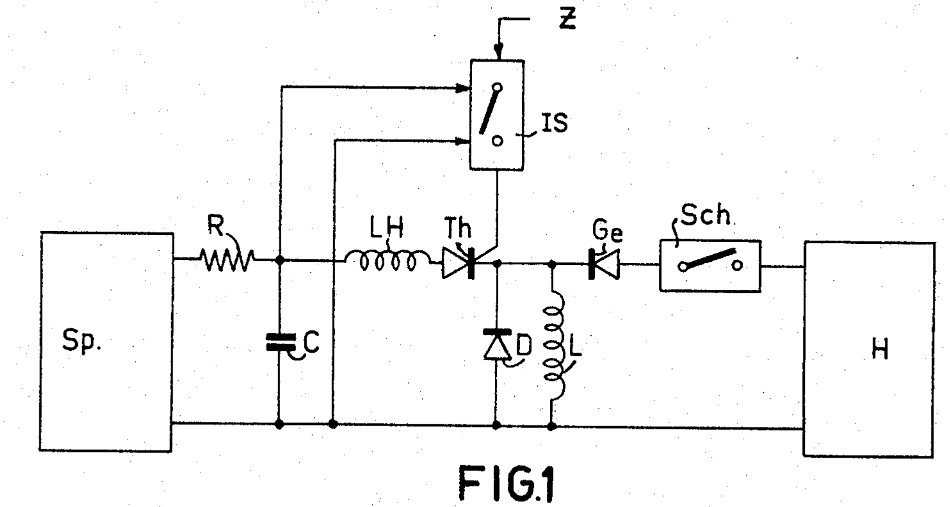
FIGURE 1 shows a switching amplifier.

A capacitor C constitutes a voltage source dependent upon the condition of charge. It is charged up to the nominal voltage, by an external voltage source $S_p$ during the intervals between two switching pulses, absorbing a given amount of energy $W=\frac{1}{2}CU^2$ which must correspond in value to the energy $W=\frac{1}{2}LJ^2$ required by a load inductor L (FIGURE 1). The capacitor C and the load inductor L together constitute an oscillatory circuit having an oscillation frequency $$F=\frac{1}{2\pi\sqrt{LC}}$$

which is damped by iron and copper losses of the load inductor. Since the current can flow in only one direction due to the rectifying action of a thyristor $Th$ the oscillation of the oscillatory circuit is limited beforehand to a half wave. The energy stored in the capacitor C is thus transported once to and fro between the capacitor C and the inductor L. However, since the object of the circuit is to feed the inductor one time with the amount of energy $W=\frac{1}{2}LJ^2$, the oscillating process must already be interrupted after a quarter of a wave. This is achieved in a simple manner by means of a catching diode D connected in parallel with the load inductor and which short-circuits the inductor for the oscillating process which normally follows, the discharge of capacitor C thus abruptly ceasing. The increase in the current flowing through the inductor is thus terminated and the period of increase is found to be $$t_{an}=\frac{T}{4}=\pi/2\sqrt{LC}$$

The current flowing in the inductor at the instant of switching-off flows further through the catching diode and gradually decreases with the $L/R$ time constant of the inductor L and the diode D. If, however, the load inductor L has to remain switched-on for a longer period, it is preferable to supply the holding current through a switch $Sch$ from a separate current circuit H. This circuit is fed from a supply source of very low voltage and must be safe-guarded against the high operating voltage of the switching-on circuit by means of a diode $Ge$. Due to the low voltage, a very low energy is required during the continuous energisation.

After the load inductor L is switched-on, the capacitor C may be charged again through a resistor R. However, to this end, the current flowing through the thyristor $Th$ must first for the extinction thereof become lower than a characteristic value, the value of the so-called holding current. This is not always achieved with security by the aforementioned action of the catching diode, since the current, instead of returning from its maximum value to zero, decreases only to the value of the charging current produced by the operating voltage with charging resistance R. Since, in most uses, the charging current is greater than the holding current of the thyristor, an additional switching step is necessary for obtaining a secure extinction.

According to the invention, this step consists in that an additional auxiliary inductor LH is included in the oscillatory circuit. This auxiliary inductor remains active when the load inductor L is short-circuited by the catching diode D, thus causing the oscillating process to be continued, although at a different frequency and with a different peak amplitude. Due to the oscillating, further a sinusoidal decrease of the current from its maximum value to the zero value and charging of the capacitor C with a voltage of opposite polarity are obtained. When the current becomes less than the holding current the thyristor T*h* extinguishes and a reverse voltage is applied to the thyristor which can thus give away the charge stored in it. The auxiliary inductor LH must be so proportioned that an adequate reverse voltage appears at the thyristor. This is the case if the auxiliary inductance is approximately from $\frac{1}{10}$ to $\frac{1}{5}$ of the load inductance. After the thyristor is switched off, the charging of capacitor C commences. The charging process is effected with the time constant $\tau$=R.C. This must be so proportioned as to be shorter than the shortest time interval between two switching-on pulses.

Figure 2:
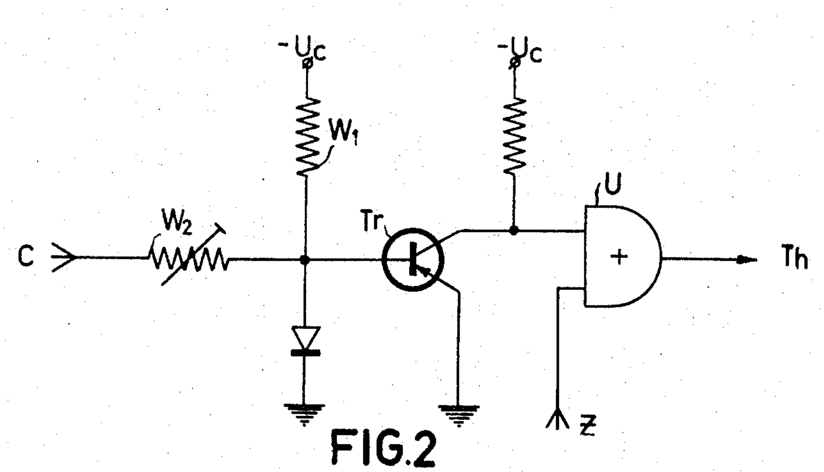
FIGURE 2 shows one embodiment of an igniting pulse gating circuit.

During the period of charging none of the pulses Z must reach the control electrode of the thyristor T*h* since the voltage serving to cut-off is proportional to the voltage of the capacitor at the instant of ignition so that only a completely charged capacitor C ensures a reverse voltage sufficient for extinction. To ensure this, namely that no igniting or interfering pulse Z can reach the thyristor T*h* during the period of charge, according to the invention, the igniting pulse lead is cut-off during this period by a gating circuit. The gating circuit IS may be in the form of an and-gate U (FIGURE 2), that is to say a switching-on pulse is passed only if, at the same time, a signal "thyristor ready for ignition" is present. This safety signal is derived from the instantaneous voltage of the capacitor by voltage division and amplification.

The signal appears at the collector of a transistor T*r* which is conducting in the rest condition. If the voltage of the capacitor exceeds a predetermined threshold value, which is adjustable by means of a resistor voltage divider $W_1$–$W_2$, the transistor T*r* is suddenly cut-off, resulting in a negative voltage step at its collector. The potential is chosen so that the blocking of the igniting pulse is then eliminated. However, after each ignition, the voltage at the capacitor C is so low that the blocking is active.

By introducing the auxiliary inductor LH and the gating circuit IS the switching amplifier satisfies any requirement imposed. The total consumption of energy for each switching operation is very low as compared with that of other circuits, and is substantially equal to only twice the magnetisation energy. Due to the high dielectric strength of the thyristor, it is furthermore possible to obtain exceptionally short periods of current rise and field upbuilding. In a circuit including a load inductor of 3 mh. and at an operating voltage of 360 volts, it was possible to obtain a rise time of 35 $\mu$sec. In a test circuit with higher currents and a smaller inductance even a current rise time of only 12 $\mu$sec. was measured.

What is claimed is:

1. A switching circuit for rapidly switching an inductive load, comprising a current source, a capacitor forming an oscillatory circuit with said inductive load and having a first frequency, resistive means connecting said capacitor to said source, an auxiliary inductor, a semiconductor controlled rectifier having an anode, a cathode and a control electrode, means coupled to said control electrode for selectively igniting said rectifier, the anode cathode path of said rectifier being connected in series with said auxiliary inductor and said inductive load, said auxiliary inductor, said rectifier and said inductive load being connected across said capacitor, and a diode connected across said inductive load for shorting said load, said diode and the anode cathode path of said rectifier being connected in poled opposition, said auxiliary inductor and said capacitor forming a further oscillatory circuit during said shorting having a frequency differing from said first frequency.

2. The combination of claim 1 wherein said means for igniting said controlled rectifier includes a source of control pulses, pulse gating means having a first input terminal connected to the said capacitor and responsive to the charge on said capacitor to prevent ignition of said controlled rectifier before said capacitor has been substantially charged by said current source, a second input terminal connected to said source of control-pulses and an output terminal coupled to said control-electrode of said controlled rectifier.

3. The combination of claim 2 wherein said pulse gating means comprises a transistor stage and a multi-input AND-gate said transistor stage being arranged between said capacitor and a first input terminal of said AND-gate, and means applying said control pulses to another input terminal of said AND-gate.

References Cited

UNITED STATES PATENTS

| | | | |
|---|---|---|---|
| RE 26,119 | 12/1966 | Slater | 307—88.5 |
| 3,189,782 | 6/1965 | Heffron | 307—88.5 |

FOREIGN PATENTS

| | | |
|---|---|---|
| 1,237,802 | 6/1960 | France. |

ROY LAKE, *Primary Examiner.*

L. J. DAHL, *Assistant Examiner.*